United States Patent [19]
Park et al.

[11] Patent Number: 5,987,722
[45] Date of Patent: Nov. 23, 1999

[54] APPARATUS FOR TRANSPORTING LEAD FRAMES

[75] Inventors: Bok Sik Park, Suwon; Deog Gyu Kim, Cheonan; Sung Hee Cho, Cheonan; Yong Choul Lee, Cheonan, all of Rep. of Korea

[73] Assignee: Samsung Electronics Co., Ltd., Kyungki-do, Rep. of Korea

[21] Appl. No.: 08/608,249

[22] Filed: Feb. 28, 1996

[30] Foreign Application Priority Data

Feb. 28, 1995 [KR] Rep. of Korea .......................... 95-4187

[51] Int. Cl.⁶ .................................................. H01L 21/68
[52] U.S. Cl. ............................................. 29/25.014
[58] Field of Search ................................. 29/25.01

[56] References Cited

U.S. PATENT DOCUMENTS 4,555,876 12/1985 Ohtake .
4,749,329 6/1988 Stout .
4,851,902 7/1989 Tezuka et al. .
4,978,253 12/1990 Lazzari .
5,549,716 8/1996 Takahashi et al. .

FOREIGN PATENT DOCUMENTS 3120696 3/1982 Germany .

Primary Examiner—David E. Graybill
Attorney, Agent, or Firm—Pillsbury Madison & Sutro

[57] ABSTRACT

A method and appratus for transporting a lead frame on air rails, wherein the lead frame is moved by pressurized air, and an in-line package assembly system using the method and apparatus.

21 Claims, 15 Drawing Sheets

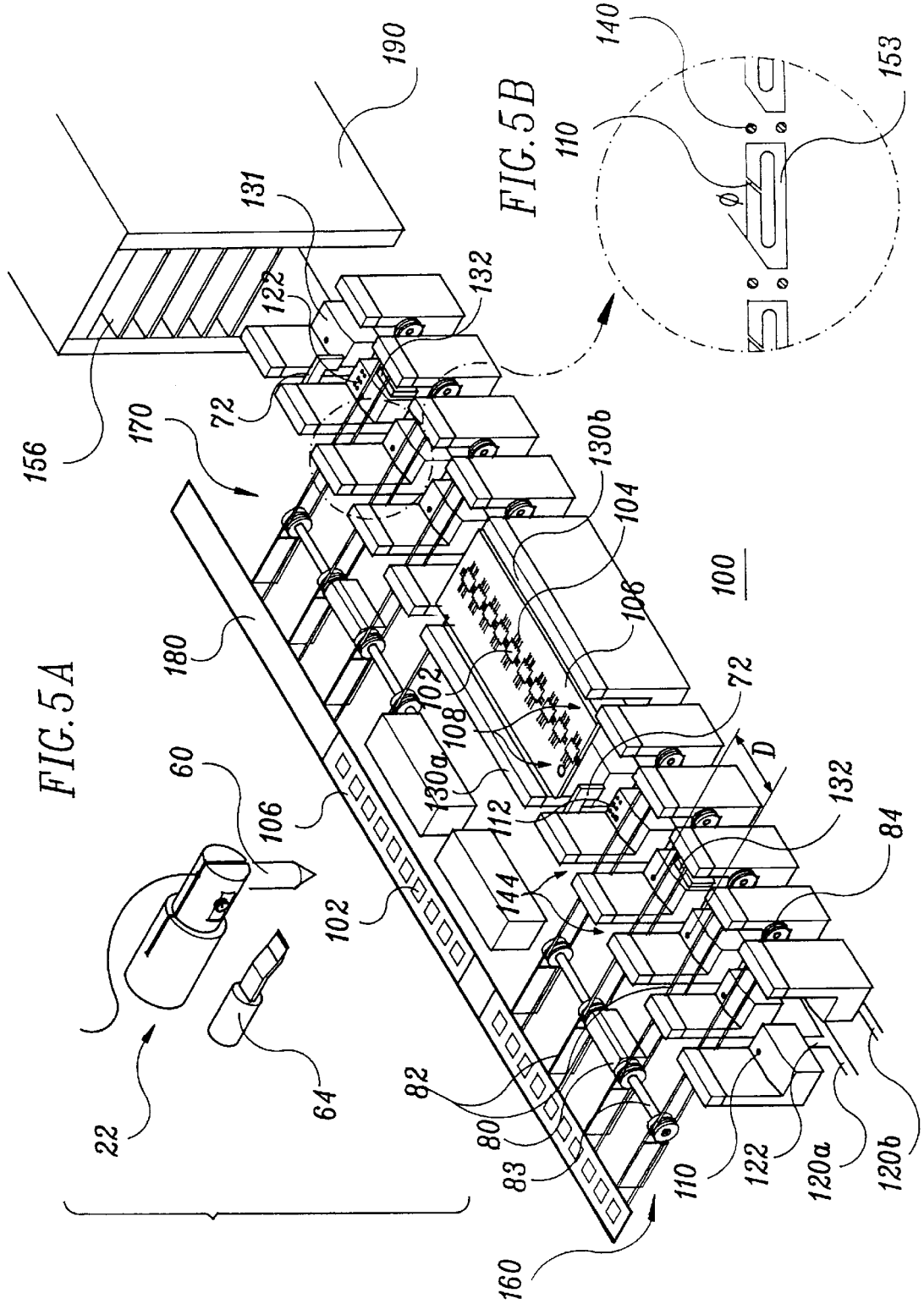

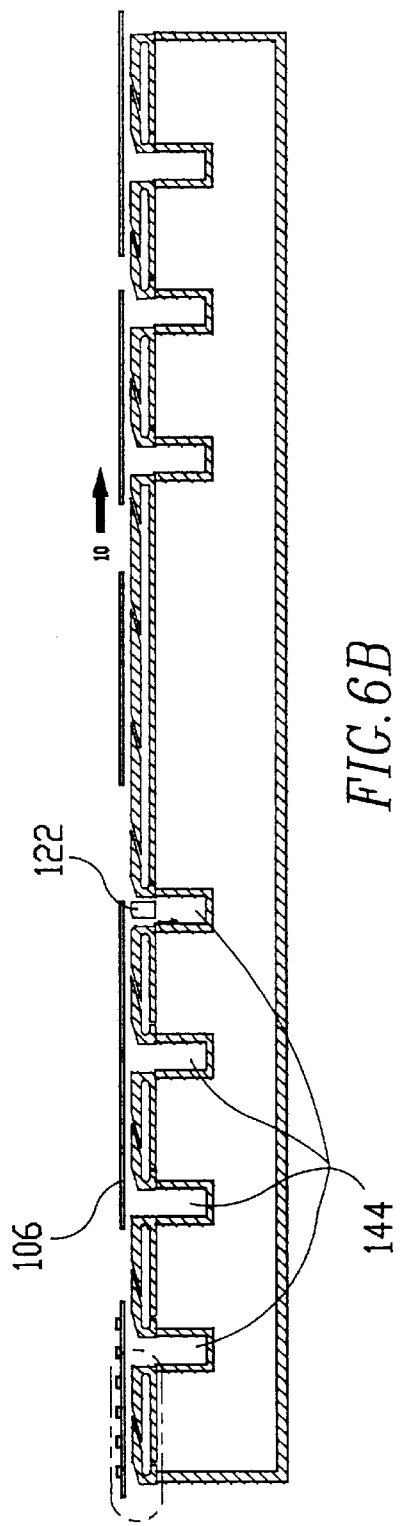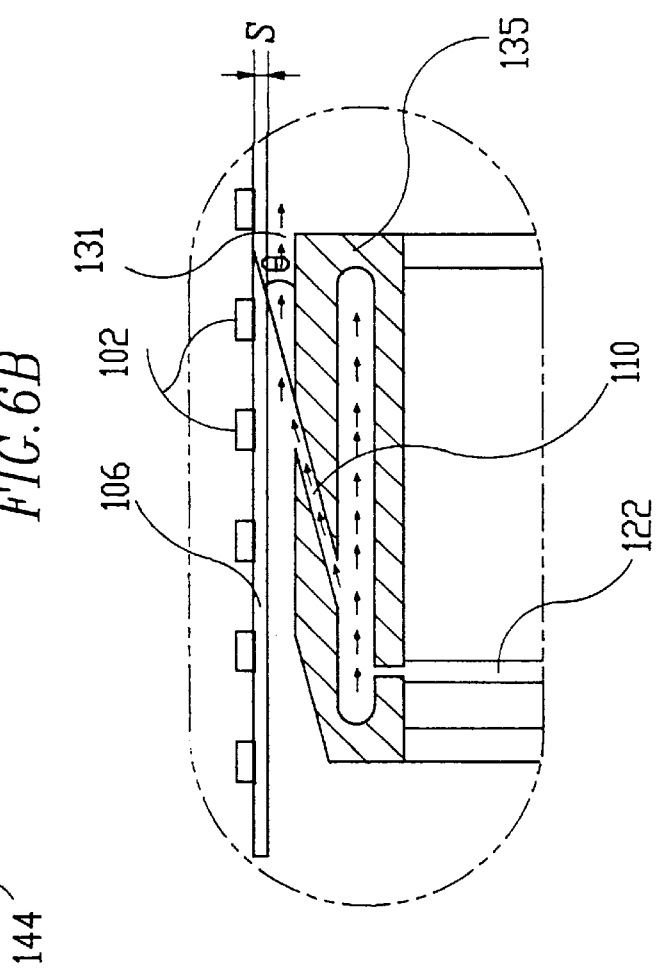
FIG.6A
FIG.6B

APPARATUS FOR TRANSPORTING LEAD FRAMES

BACKGROUND OF THE INVENTION

1. Field of the Invention.

The present invention generally relates to a method and apparatus for transporting lead frames, and to an in-line system using the same.

2. Description of the Related Art.

Usually, a semiconductor chip-assembly process begins with a die-bonding process in which an individual chip ("die") separated from a silicon wafer, and having a plurality of integrated circuit elements, is attached to a lead frame. A lead frame is a plate having leads for electrically connecting the chip to external electrical elements, and is made of copper alloys or iron-nickel alloys. It also supports the chip during subsequent steps in the assembly process. The lead frame onto which the chip is attached is electrically coupled to the chip through wires or by directly bonding parts ("inner leads") thereof to metal pads of the chip. Then, the chip semi-assembly is encapsulated to provide protection from environmental effects, such as moisture, dust, and physical and electrical shocks. A thus-obtained package is then subjected to a cutting/forming process to cut and form the leads to adapt the package which includes the chip to being mounted on a circuit board. Each package thus manufactured is then subjected to various electrical and reliability tests, and the packages which pass those tests are supplied to consumers.

As described above, the semiconductor package-assembly process includes many steps, and the capacity of each step is different. Therefore, carrying out continuously the steps as a succession of steps is very difficult. For example, four chips can be attached to die pads of four lead frames in the die-bonding process, while only one chip can be electrically connected to the lead frame in the wire-bonding process during the same period of time. Moreover, for the LOC (Lead On Chip) package assembly process, it approximately 0.8–2.0 seconds are required to bond the chip to the die pad with a polyimide tape by applying heat and pressure thereon, which is about half the time required for the subsequent wire-bonding process. To solve the problems associated with such differences between the required time in each of the steps, and to improve the productivity of the package-assembly process, an integration system called an in-line system has been proposed, in which one die-bonding apparatus is coupled with more than two wire bonding apparatuses. Such in-line system is particularly advantageous for large-scale assembly and production factories, such as memory element production factories.

FIG. 1 is a schematic diagram of an in-line system. The system (40) comprises one die-bonding apparatus (10), four wire-bonding apparatuses (20a, 20b, 20c, 20d) and a transport apparatus (30) for transporting the lead frames (16).

Each of a plurality of lead frames in a stocker (not shown) is fed into a working rail (9) by a lead frame separator (1). Lead frames (2) on the rail (9) have lead patterns which are to be electrically connected to the electrical pads of respective chips, these patterns being connected to each other through a side rail, forming a strip. The wafer cassette (5) contains wafers having integrated circuit elements and which have already been subjected to back-lapping, scribing and back-tape-attaching. When a wafer (not shown) is mounted on an xy-table (6), chip separator (7) separates a plurality of individual chips from the wafer. The separated chips are then transported to the die-bonding head (4) by the chip transport module (8). The die pad (not shown) of the lead frame (2) at the rail (9) beneath the bonding head (4) is supplied with dots of an adhesive such as Ag-epoxy. For the case where the chip is directly attached to the lead of the lead frame without a die pad, for example in LOC packages, the dotting of the adhesive is not required.

The bonding head (4) aligns the the lead frame and the chip at an appropriate position, where they will be attached together, and presses them under heat and pressure to bond them together.

The lead frame onto which a chip is attached by die-bonding apparatus (10) is then moved into a prebake chamber (12) where the adhesive is cured at a predetermined temperature and time.

Buffer (14) is composed of a plurality of inlet magazines (18), into which the lead frames are transported after the completion of die-bonding, and stacked, before they are transported to the wire-bonding stage. The reasons that a plurality of magazines are used to feed lead frames into the wire-bonding stage are that, first, even if the die-bonding apparatus (10) does not work, the lead frames can be continuously fed into the wire-bonding stage. Second, when the die-bonding apparatus (10) cannot output sufficient die-bonded lead frames, lead frames that have been die-bonded by a separate, ex-line die-bonding apparatus are fed into buffer (14) in order continuously to carry out wire-bonding. A lead frame (16a) having a chip attached thereto, which is transported to the lead frame-transport module (30) from one of the inlet magazines (18), undergoes wire-bonding by one of four wire-bonding apparatuses (20a through 20d).

Each wire-bonding apparatus (20) is composed of a loader (24), an unloader (26) and a wire-bonding head (22). The wire-bonded lead frame (16) is transported by the transport module (30) to one of the outlet magazines (28), from which the lead frame will be transferred to a subsequent assembly step, such as molding of a capsule of plastic material in protective relation to the chip and its connections to the frame. The outlet magazines (28) have the same structure as that of the inlet magazines (18) of buffer (14).

The control part (15) controls the transport of the lead frames and the overall operation of the system, and comprises a microprocessor. Its initial operational values are determined by the size and shape of the lead frames as well by the structure of the chips.

The lead frame transport module (30) in such an in-line system employs conveyor belts for transporting the lead frames, as shown in FIG. 2A. The lead frame transport module (30) is composed of two rail bodies, including first (50a) and second (50b) rail bodies, which have the same structure as one another. The rail body (50) has a large number of rollers (52), onto which belts (54) are wound. The first rail body (50a) is interconnected to the second rail body (50b) by a connector board (56). The width (W) of the board (56) is adjusted, depending on the width of the lead frame (16) which is to be transported. The power for moving the conveyor belt is supplied by a motor, which is located between the first rail body (50a) and the wire-bonding head (22), although not shown in FIG. 2A. The rotational power of the motor is transferred to the power transfer shaft (57), one end of which is coupled to the power transfer roller (58) of the first rail body, while the other end thereof is coupled to the power transfer roller (58) of the second rail body, thereby making it possible to control the moving speed of the conveyor belts (54) of the first rail body so that it is the same as that of the second rail body. The side rail of the lead frame is disposed in contact with the conveyor belt (54), and moves upon the moving of the conveyor belt (54) powered by the motor.

When the lead frame (16) reaches a certain predetermined position along the rail (50), sensor a (70) detects it and transfers the detected signal to a stop (72). The "¬"-shaped stop (72) is hidden within a split (74) formed in rail body (50) when the lead frame passes, and is projected outside the split when a signal is received from the sensor (70) to stop the lead frame. The moving lead frame stops when it collides with the stop (72). Since the moving and stopping of the lead frame is controlled by the control part of the in-line system (for example, the controller (15) in FIG. 1), the motor can be controlled to stop the conveyor belt (54) and consequently the lead frame. Nevertheless, in such case, since the lead frame leans toward its traveling direction by the action of inertia, the stop (72) should be employed in order accurately to control the stopping of the lead frame at a proper position.

Detection of the position of the lead frame is required when a lead frame arrives at the loader (24) and the unloader (26) of a certain wire-bonding apparatus among a plurality of wire-bonding apparatus. FIG. 2A shows a state in which the die-bonded lead frame (16a) is moved to the wire-bonding apparatus from the rail (50) by the loader (24) of wire-bonding apparatus, and the wire-bonded lead frame (16c), which is placed on unloader (26), stands ready for return to rail (50).

Since the loader the (24) and unloader (26) have the same structure and operation, only the loader (24) in FIG. 2A will be described. The loader (24) employs a belt for transporting lead frames. Thus, the loader and unloader are each composed of a belt (82), a roller (84) onto which belt is wound, and a motor (80) supplying power to the belt. The belt wound onto the roller, which is on the rail (50), is hidden in the split (74) formed in the rail (50) during the transport of lead frame. When the sensor (70) detects the position of the lead frame and the lead frame stops due to the stop (72), the belt (82), hidden in the split, and the roller (84) are moved upward, above the shaft (83), and the lead frame (16a) is transported to the wire-bonding apparatus, according to movement of the belt (82) of the loader.

The bonding head (22) of the wire-bonding apparatus is composed of a capillary (60), into which gold or aluminum wire (62) is fed, and a trimmer (64) for cutting the wire after the completion of wire-bonding between the leads of the lead frame and the metal pads of the chip. After completion of wire-bonding of each individual chip (66) attached to a lead frame (16b), the lead frame is moved to the unloader (26), where the lead frame is moved to the rail by movement of the belt of the unloader (26).

The above-described lead frame transport module (30) of a conveyor belt-type has problems associated with use of many rollers (52) (for example, 400 rollers) and belts (for example, 16 belts). For example, abrasions of parts thereof due to mechanical friction therebetween. That is to say, as shown in FIG. 2B, an individual roller (52) is composed of a pivotal shaft (53), a bushing (55) and a bearing (51), which will be abraded during rotation of the roller, and, therefore, reach a point where it needs to be replaced. Moreover, dust generated during the abrasions are critical contaminants, which cause significant semiconductor failures. Further, even if only one part is worn out, the whole system should be stopped in order to replace the worn part, resulting in a reduction in productivity, and in an increase in the production cost.

Such problems are not limited to in-line system, but are common to all apparatus employing conveyor belts for transport.

Besides, the conveyor belt-type transport systems also have other problems associated with instability of the transport rails, which will be described with reference to FIGS. 3 and 4.

FIGS. 3A and 3B are sectional views showing the transport of the lead frames using a conventional transport having a conveyor belt. In order to simplify the drawings, the sensor, motor and power transferring parts are omitted. As the belt (54) moves in the direction indicated by the arrow, a lead frame (16), which is disposed in contact with the belt through its side rail, moves accordingly. Although FIG. 3B shows wire-bonding of a chip (66) to a lead frame (16) by means of wires (62), if it shows lead frame fed into loader (24 in FIG. 2) of wire-bonding apparatus, the lead frame is just die-bonded.

As described above, since the surface the of belt (54) is not peripheral to the moving direction of the lead frame, and the belt (54) passes through split (74) of the lead frame stop (72) or the loader/unloader of the wire-bonding apparatus, many parts of the belt (54) cannot be contacted with the side rail of lead frame. Further, since each roller (52) is at a different height, and the belt (54) droops due to tension, the lead frame (16) moves on uneven surfaces of belt (54).

In particular, the lead frame (16), passing the vicinity of the split (74) is apt to be curled into the space between the belt (54) and a roller (52), causing a failure, as can be seen from FIG. 4A.

The difference between the moving speeds or heights of the rails (50a, 50b) may cause a reversion of the lead frames (see FIG. 4B), overlapping of two lead frames (see FIG. 4C), or, in the worst case, cause a swerving or derailment of the lead frame from the rail (see FIG. 4D).

Moreover, since the lead frame moves with waves, in the case of a very thin lead frame, for example, a TOSP (Thin Small Outline Package), the sagging of the bonded is so large that they may contact the, chip be or broken during the transport of lead frame (see FIG. 4E). According to the observation of the inventors, a thin lead frame with less than a 6 mil thickness cannot be transported using a conveyor belt-type system.

If LOC (Lead On Chip) packages each having a chip attached to the lower surface of a lead frame are applied to a conveyor belt-type transport system, they may be damaged, due to contact of the chip with the belt, and consequently they cannot be applied to a conveyor belt-type transport system.

SUMMARY OF THE INVENTION

Thus, an object of the invention is to provide an improved lead frame transport method and apparatus, which are free from the above-described problems associated with the conventional transport apparatus.

Another object of the invention is to increase productivity of a semiconductor assembly process, while reducing the production cost by preventing mechanical abrasion of the lead frame transport apparatus.

Another object of the invention is to the reduce failures of packages, while increasing productivity by improving the cleanliness of the working place of semiconductor package assembly.

Another other object of the invention is to prevent various failures during lead frame transport in a semiconductor package assembly system.

A further object of the invention is to transport very thin lead frames for TSOP efficiently.

Another object of the invention is to provide a stable transport of lead frames in LOC package assembly.

Another object of the invention is to increase the working efficiency of an in-line lead frame transport system, by stably transporting lead frames, as well as by increasing the transport speed.

This object can be accomplished by an improved lead frame transport apparatus and method, which comprises providing floating transport of the lead frames, by blowing air at a certain degree into the lead frame transport rail.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which:

FIGS. 5A and 5B are a cut-away partial perspective view and a partial enlarged view of the lead frame transport apparatus according to the present invention, respectively;

FIGS. 6A and 6B are sectional and enlarged partial views showing the steps of transporting lead frames according to the method of the present invention, using an air-feeding mechanism, respectively;

DETAILED DESCRIPTION OF THE PREFERRED EMBODIMENT OF THE INVENTION

Figure 1:
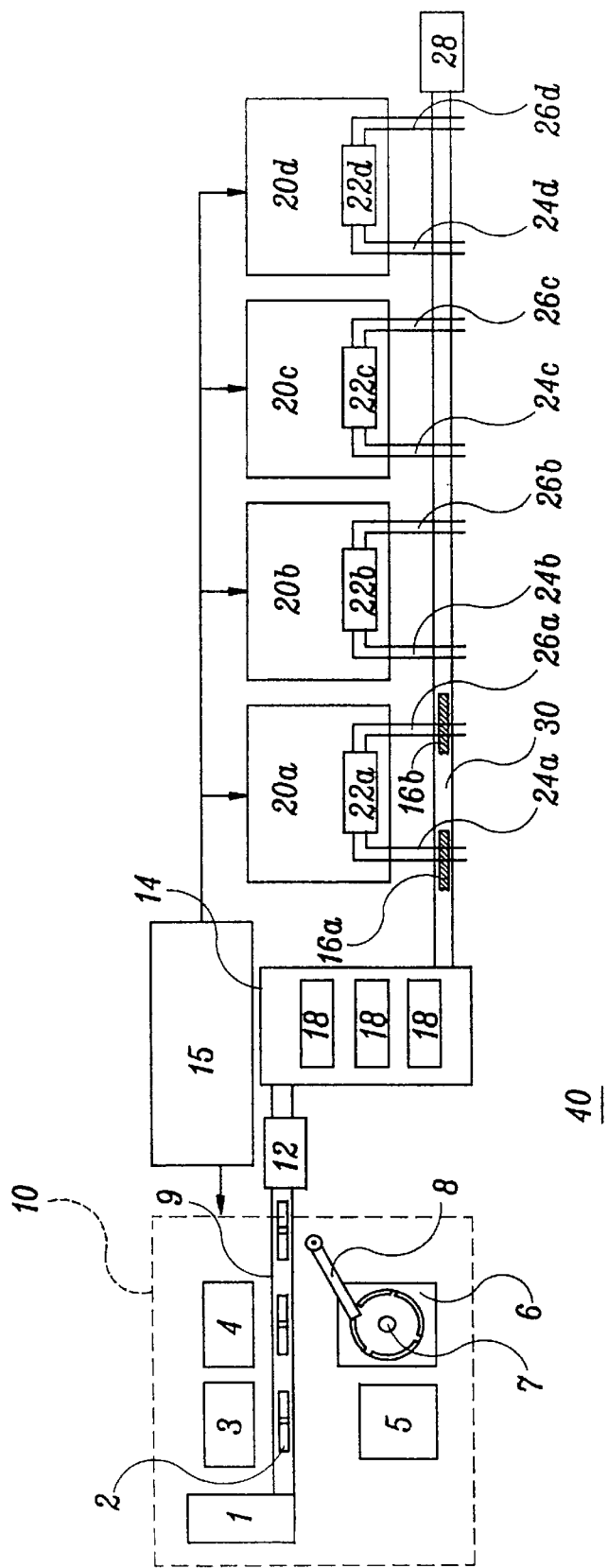
FIG. 1 is a schematic diagram showing a prior art in-line system using a die-bonding apparatus in integration with a plurality of wire-bonding apparatuses.

The present invention will now be described in more detail with reference to accompanying drawings.

FIG. 5A is a partial cut-away perspective view of lead frame transport apparatus according to the present invention. The lead frame transport apparatus according to the present invention (100) does not have the conveyor belt, roller and motor which are employed for the conventional lead frame transport apparatus as described above. Instead, compressed air supplied through air ducts (120, 122) is used as the driving power for moving the lead frames. That it to say, the lead frames can be moved on the air rail (130) by the action of pressurized air supplied through theair vent holes (110) formed within the rail (130) at an angle of certain degrees with respect to the horizontal plane (131) of the rail (130). In order to move both side rails (108) of the lead frame (106) by the action of the compressed air, a pair of air rails, i.e., first air rail (130a) and second air rail (130b) are provided. Air vent holes (110) are preferably uniformly spaced so that a uniform force can be applied to each of the lead frames. In FIG. 5, a loading/unloading belt (140) and a roller (142) for loading/unloading lead frames into/from an assembly part, for example a wire-bonding apparatus, are formed at the split (144). The loading/unloading belt may be any one employed in the conventional conveyor belt-type transport system.

Each air rail (130) comprises many sub-rails (153) as shown in FIG. 5B. The sub-rails (153) preferably have an identical size and shape relative to one another, since the distance between the air vent holes (110) in the sub-rails (153) can be constant. Consequently, the power applied to the lead frames through the air vent holes (110) can be uniform throughout the rail (130). The front top edge of each of the sub-rails (153) has a slant surface, the slope of which has an angle of θ, in order to prevent the lead frame from being caught by the next sub-rail when lead frame passes between sub-rails.

A lead frame can be stopped by stopping the supply of air through the air duct (120), as well as by applying vacuum through a vacuum hole (112), when a sensor (132) detects that a lead frame moving along above a rail (130) arrives the stop position. The stop position may be that for the loading part (160) of the wire-bonding apparatus, when the lead frame should be wire-bonded. In addition to the vacuum hole (112), a stop (72), of the type which is employed in the conventional conveyor belt-type transport system, can be also used to stop lead frames in the apparatus of the invention. For this case, the vacuum hole (112) has a role to reduce the impact on the lead frame when the lead frame collides with the stop (72).

The lead frame is transferred to the rail (180) of wire-bonding apparatus and then moved to the bonding head (22), when the loading belt (82) and roller (84), which are in the split (144) of the rails (130), are lifted above the shaft (83) and the belt (82) moves, powered by the motor (80). The lead frame (106) is electrically connected to the chip (102), via wires, by the bonding head (22). After completion of wire-bonding, the lead frame moves along the rail (180) to the unloading part (170), and then is loaded onto the air rail (130) by the unloading belt. In this manner, the wire-bonded lead frame (156) is stacked into the magazine (190) and then transported to the subsequent assembly processes, for example a molding process, to be encapsulated to form a package body.

FIGS. 6A and 6B are sectional and partial enlarged views showing the steps of transporting a lead frame by employing the air transport system according to the present invention, respectively. Pressurized air, blown into the rail through the air duct (122) is vented to tilted vent holes (110) formed at an angle of θ with respect to the upper surface (131) of the rail (130). Then, the lead frame, on vent holes (110), is forced to move along the direction of air flow. The lead frame floats on the upper surface (131) of the rail at a height "S" from the surface (131). Of course, a lead frame placed between the air vent holes (110) may contact the upper surface (131) of the rail (130), the whole lead frame is substantially floating on the rail, considering that the contact resistance of the lead frame with the rail is almost zero.

When the air rail transport method and apparatus described above in relation with FIGS. 5 and 6 are applied to an in-line system in which a die-bonding apparatus is integrated with at least two wire-bonding apparatuses, the whole system will be the same as that shown in FIG. 1, except for the lead frame transport rail, pressurized air supplying part and control part for controlling air flow.

In order to apply air rail transport techniques to an in-line system, the most important parameters are the ejection angle of the air with respect to the horizontal surface of lead frame strip (i.e., "θ" in FIG. 6B) and the pressure of the air applied to the lead frame. According to the experiments carried out by the inventors, the preferred values for these parameters are as follows:

When the air vent is formed at an angle of 90 degrees with respect to the horizontal plane, and air is supplied in the horizontal and vertical directions in order to float a lead frame on rail and, to move lead frame, a very high air pressure (for example, about 90–100 liters of air/min for one wire-bonding apparatus), is required. The reason such a high pressure is required is that the area of the lead frame, to which pressurized air be applied, is so small. Furthermore, there may occur a derailing of a lead frame from the air rail, due to the loss of control.

On the other hand, when the angle of inclination of the air vent holes is less than 90 degrees, derailment failures of lead frames still occur until the angle is reduced to about 40 degrees. At an angle of about 30 degrees, although such derailment failures can be avoided, the lead frame strip forms a wave between the parts where air is directly injected and the parts where air is not directly injected. Therefore, a thin lead frame cannot be effectively transported at such an angle.

When the angle is adjusted to be 10–20 degrees, the above-described problems can be avoided and lead frame can be effectively transported. The air flow applied to one wire-bonding apparatus is 30–60 liters/min, when the diameter of air vent is about 3 mm and the weight of lead frame is 3–4 grams.

When comparing the time required to deliver a lead frame from the magazine ("18" in FIG. 1) of the lead frame-mounting stage to the magazine ("28" in FIG. 1) in the conventional conveyor belt type system and in the air rail-type system of the present invention, the time is reduced from about 4.2 seconds to about 2.4 seconds.

Figure 2B:
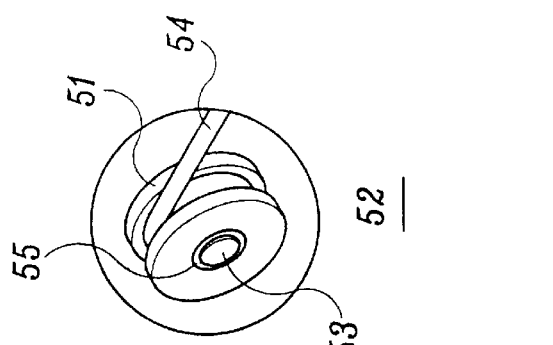
FIG. 2B is an enlarged view of a roller employed in the conventional lead frame transport apparatus.
Figure 2A:
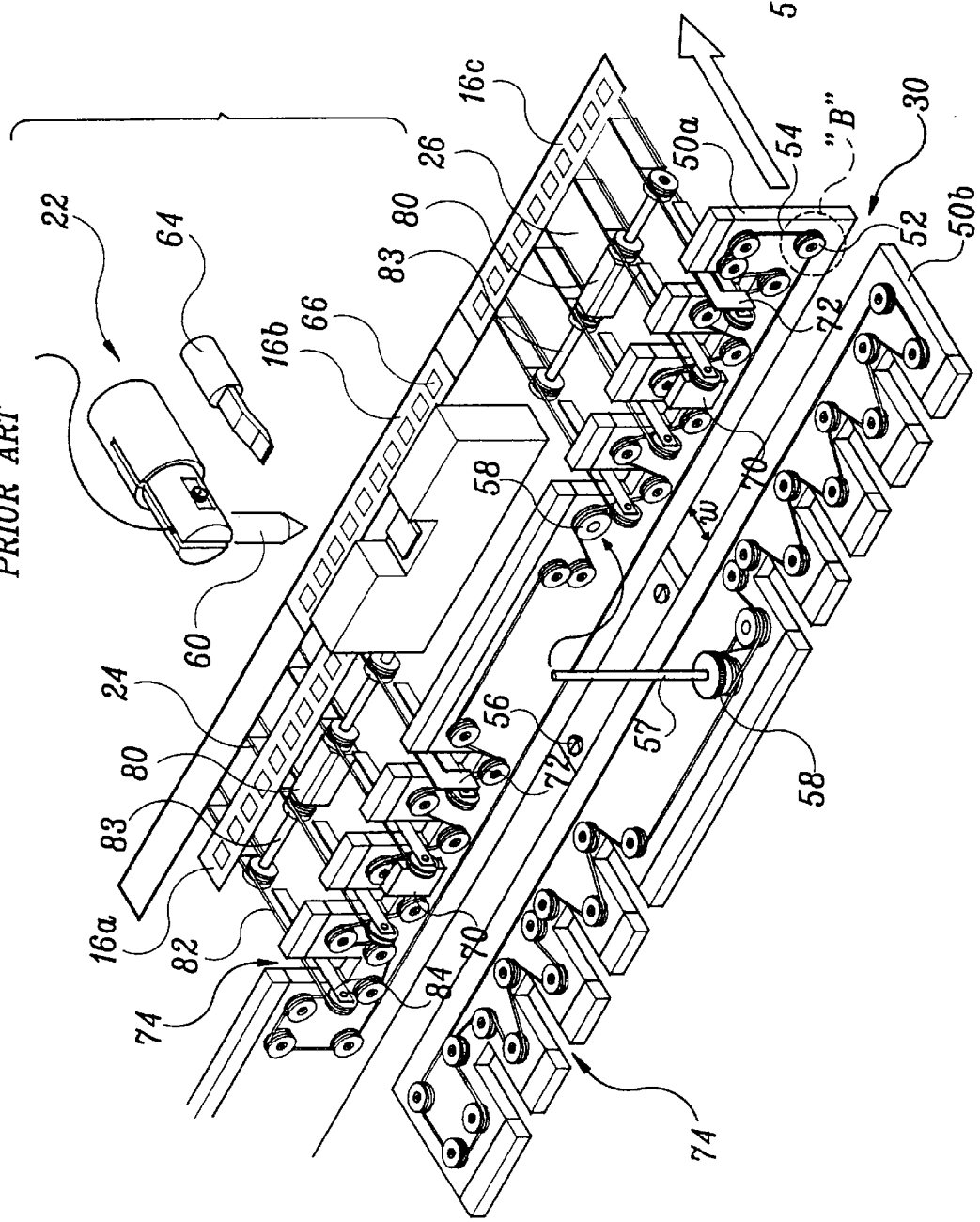
FIG. 2A is a cut-away perspective view of a lead frame transport apparatus employing a conventional conveyor belt.
Figure 3A:
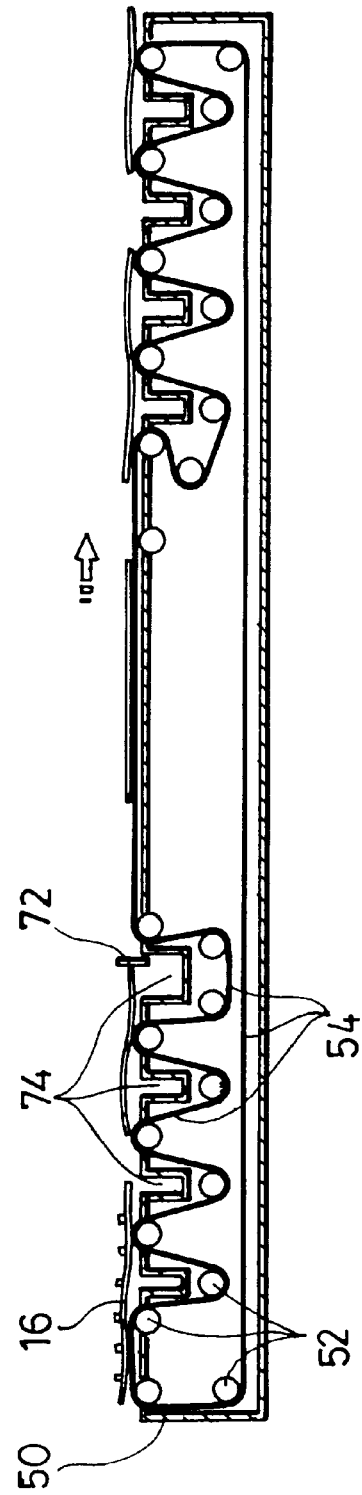
FIGS. 3A and 3B are front and side views showing the steps of transporting lead frames by using the conventional conveyor belt, respectively.
Figure 3B:
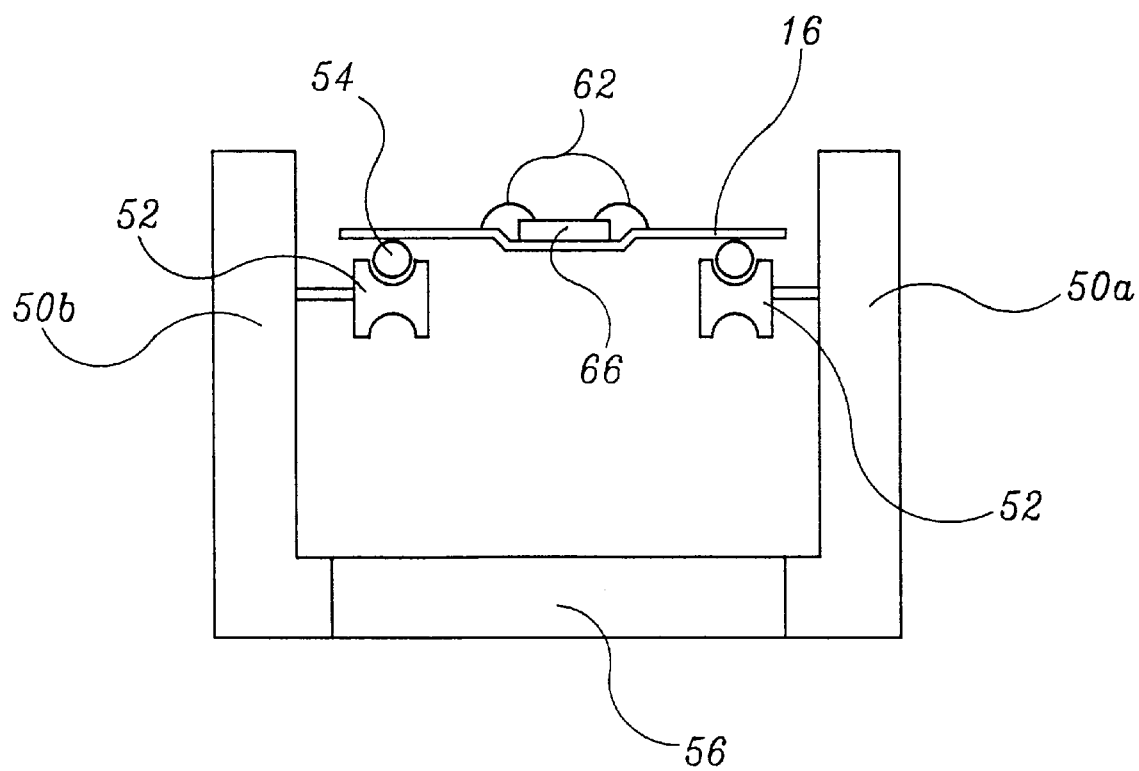
Figure 4A:
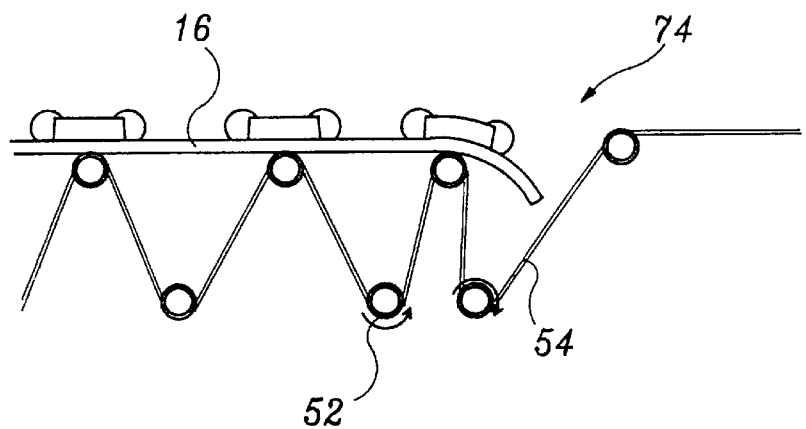
FIG. 4A shows the winding of a lead frame into the rollers of the conventional lead frame transport apparatus during its operation.
Figure 4B:
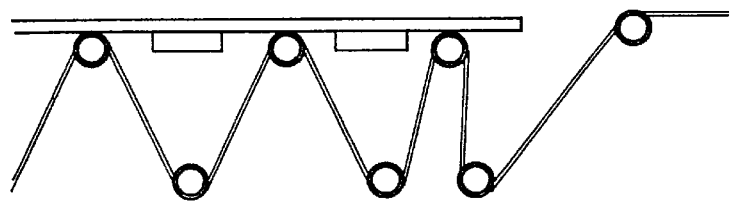
FIG. 4B shows a reversal of a lead frame during transfer thereof using the conventional lead frame transport apparatus.
Figure 4C:
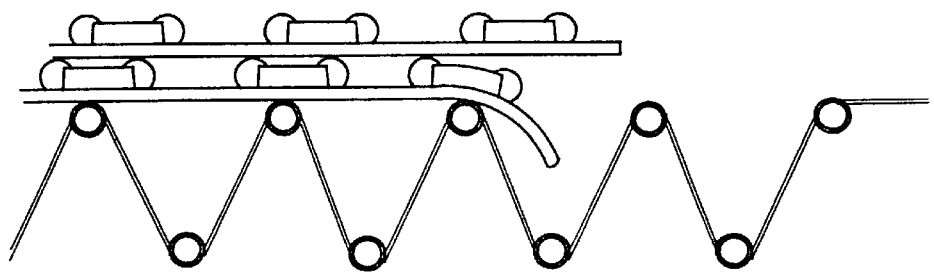
FIG. 4C shows the overlapping of lead frames during transfer thereof by using the conventional lead frame transport apparatus.
Figure 4D:
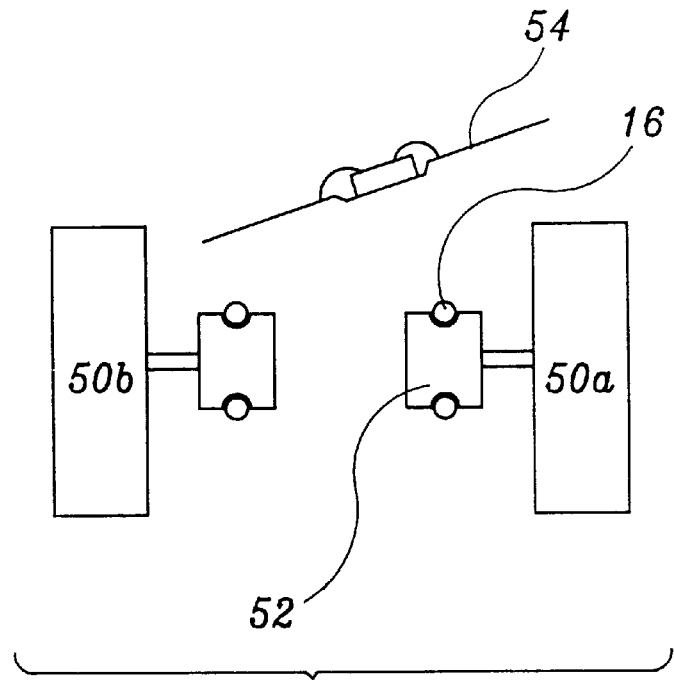
FIG. 4D shows the derailment of a lead frame during transport thereof using the conventional lead frame transport apparatus.
Figure 4E:
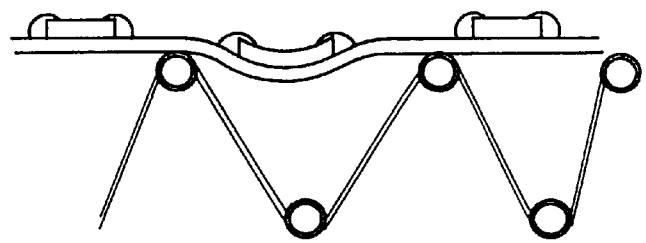
FIG. 4E shows the undulation of a strip of the lead frame during transport thereof by using the conventional lead frame transport apparatus.

According to the present invention, the lead frame is stopped by using plate-type stop ("72" in FIG. 2) as well as a vacuum-type stop ("112" in FIG. 5B) in order to reduce impact on the lead frame when the fast-moving lead frame collides with a plate stop.

The control of the stopping of the lead frame at a certain place, by detecting the moving and arriving at the certain place of thelead frame, will be compared between the conventional conveyor belt-type in-line system and the air rail-type in-line system of the present invention, with reference to FIGS. 7 and 8, hereinafter.

Figure 7:
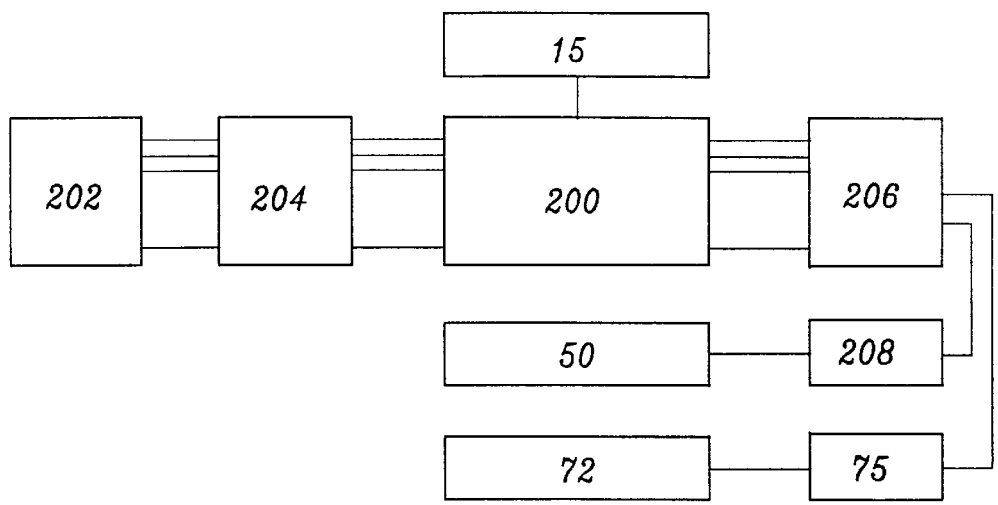
FIG. 7 is a block diagram showing the control of moving and stopping of the lead frame by using a conventional in-line system employing a conveyor belt.

FIG. 7 is a block diagram showing control of the moving/stopping of a lead frame in the conventional conveyor belt-type in-line transport system. The control part (15) is a control part for controlling the operations of the whole in-line system shown in FIG. 1. Sub-control part (200) receives/transmits control for the signal from/to control part (15), and controls the operations of lead frame transport rail (50) and stopper (72) by receiving signals detected by sensor (202). A sub-control part (200) is provided at each wire bonding apparatus. Therefore, for example, an in-line system comprising one die bonding apparatus and four wire bonding apparatuses is provided with four sub-control parts.

Sensor (202), which is placed beneath rail (50) on which the lead frame moves (see FIG. 2A), detects the position of lead frame. The position signal is transmitted from sensor (202) to sub-control part (200) via input switch (204). Sub-control part (200) transmits the signal to the control part (15), to inform as to the status of the moving lead frame, as well as to output a proper electrical signal to control the motor driving part (208) and the stopper driving part (75), via the output switch (206). Then, motor the driving part (75) works or stops rail (50) comprising the conveyor belt, depending on the signals from the output switch (206). An inactive signal will be entered into the stop-driving part (75) when the rail (50) works to move the lead frame, while the plate-type stop (72) will be sprung out of the split ("74" in FIG. 2A) formed in the rail (50) via the stopper-driving part (75).

Figure 8:
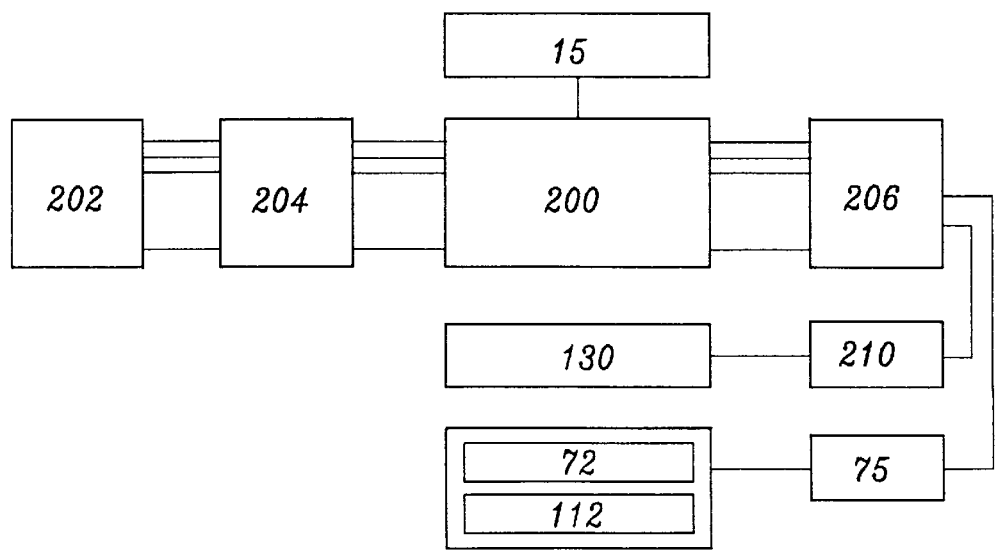
FIG. 8 is a block diagram showing the control of moving and stopping of the lead frame by using an in-line system employing an air-feeding mechanism.

FIG. 8 is a block diagram showing the control of the moving/stopping of the lead frame in the air rail type in-line transport system according to the present invention. The sensor (202), sub-control part (200), control part (15), and input and output switches (204, 206) are the same as those of conventional system in FIG. 7. According to the present invention, however, since the power to move lead frame is originated from pressurized air, and not a conveyor driving motor, the moving/stopping of the lead frame is controlled by coupling the output switch (206) to the air rail control part (210), for controlling the flowing/stoping of pressurized air via the air duct ("120" in FIG. 5A). The stop-driving part (75) controls stop (72) as well as the vacuum hole (or "vacuum stop") (112) formed in the air rail (130), when the stop-driving part receives a signal from the output switch (206). The stop (72) is controlled by opening/closing a vacuum passage, connected between the vacuum pump and the stop, with a solenoid controller, the vacuum passage also being connected to the vacuum hole (112) of the air rail (130) in order to stop the lead frame as well.

Figure 9A:
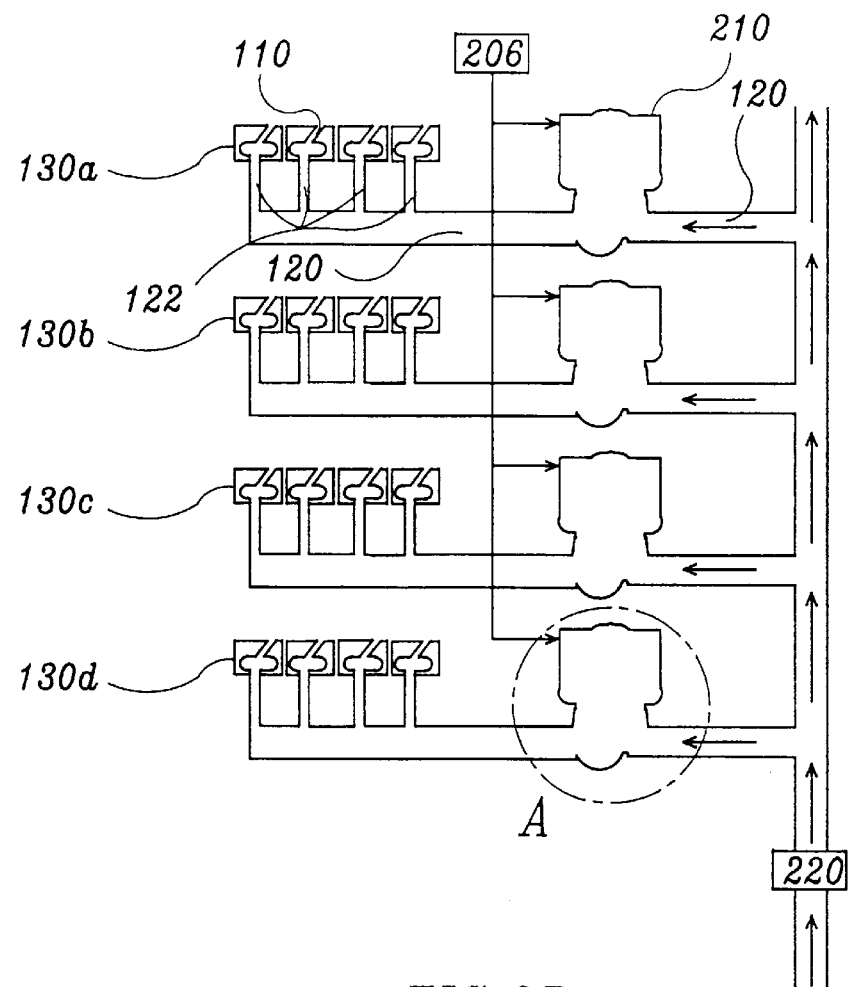
FIGS. 9A and 9B are schematic and enlarged partial views showing the supply of air by using a solenoid control mechanism as an example of an air rail controller according to the present invention.
Figure 9B:
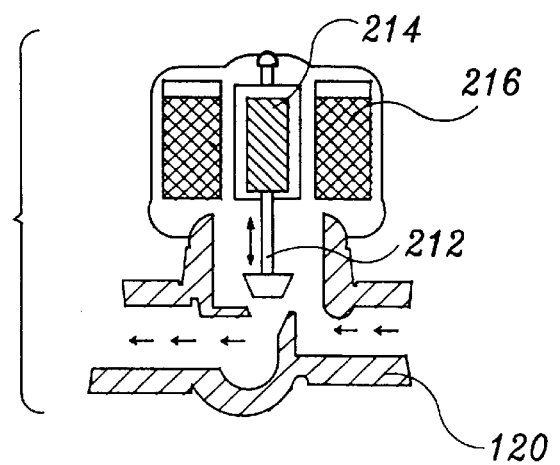

FIGS. 9A and 9B are schematic and partial enlarged sectional views showing the supply of air by using a solenoid controller, according to one embodiment of the present invention, respectively. The solenoid controller (210) is comprised of a magnetic tubular iron core (214), a coil (216) wound thereon, and a valve (212) within the core (214) which closes or opens the air duct (120). One terminal of the coil (216) is connected to an output switch ("206" in FIG. 8) of a sub-control part, and the valve reciprocates vertically, when an electric current is sent to the coil (216) via the output switch (206). When the valve (212) moves up, the pressurized air is sent via the air duct (120) to the air rail (130), and then is ejected through the air vent (110) to move the lead frame on the rail (130). When the valve (212) moves downward, the supply of the pressurized water is cut off, resulting in the stopping of the lead frame.

In FIG. 9A, four air rails (130a, 130b, 130c, 130d) serve one wire-bonding apparatus. Accordingly, if identical signals are enteredinto the coil (216) of the solenoid controller (210) via the output switch (206), the overall air rail (130) is simultaneously controlled. on the other hand, the air rails of a wire-bonding apparatus can be independently controlled by entering different signals into the individual coils (216) of the four solenoid controllers. The latter case is advantageous when the loading/unloading belt of the first wire-bonding apparatus works to mount the lead frame into the magazine, while the remaining three wire-bonding apparatuses work to transport lead frames on the air rails.

The pressurized air blown into air duct (120) may be in-situ supplied by a controller or a separate compressor. That is to say, in FIG. 9, the air-supplying part (220) may be a compressor or a controller.

Figure 10:
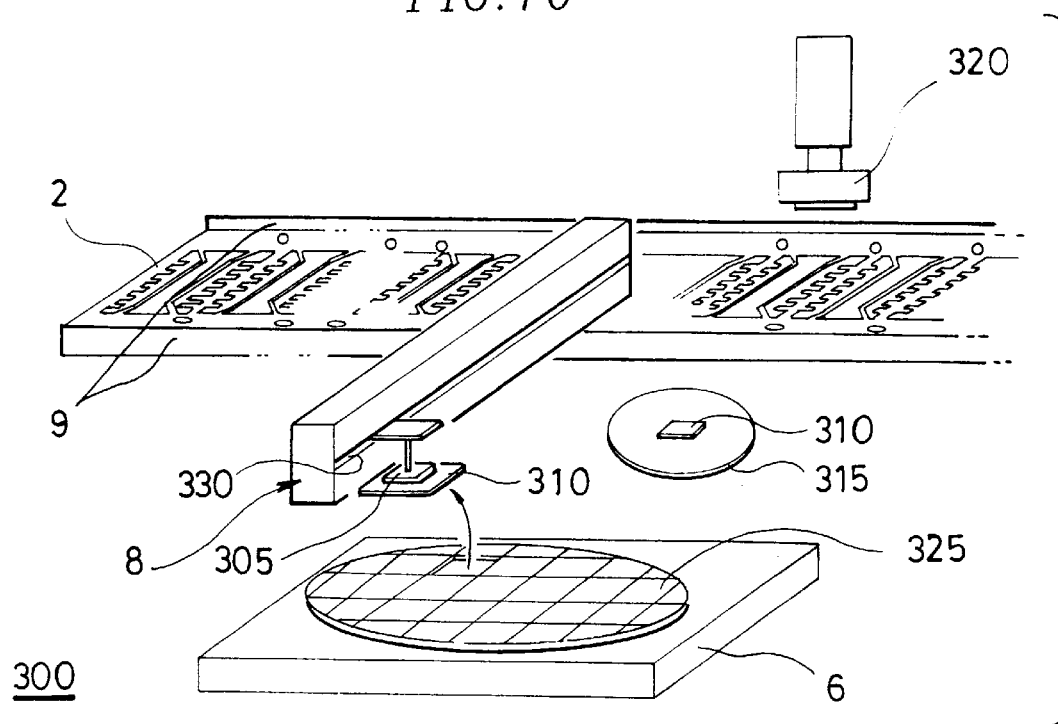
FIG. 10 is a schematic perspective view of the die-bonding apparatus in the in-line system according to the present invention.

FIG. 10 is a schematic diagram of the die-bonding apparatus of the in-line transport system according to the present invention. A wafer (325) is mounted onto an xy-table (6) from a wafer stocker ("5" in FIG. 1). The wafer (325) contains a plurality of integrated circuits and has indications of good/bad chips. The xy-table (6) can be moved along the x-and y-axes with respect to the horizontal plane of the wafer. A chip (310) is separated from the wafer (325) and moved to the bonding stage (315) along with the transport quirk (330) by the collet (305) of the chip transport part (8). The chip (310) is attached to the collet (305) by action of vacuum. When the stage (315) carrying the chip (310) attached thereonto is moved beneath the place where the chip is attached to a lead frame. The lead frame (2) is moved on the rail (9) to the bonding head (320). When both the lead frame (2) and the chip (310), which will be subjected to chip attachment, are aligned, die-bonding is conducted by the bonding head (320) under heat and pressure. For the case of an LOC package, the chip transport part (8) moves the chip (310) to the stage (315) and then the stage (315) moves to a position where the lead frame is mounted for chip attachment. On the contrary, for the case of a lead frame with die pads, the chip (310) is mounted on a die pad (not shown) of the lead frame (2) by a chip transport part (8), and an adhesive, for example, Ag-epoxy adhesive is applied onto the die pad by adhesive dispenser ("3" in FIG. 1) placed beside the bonding head.

Figure 11:
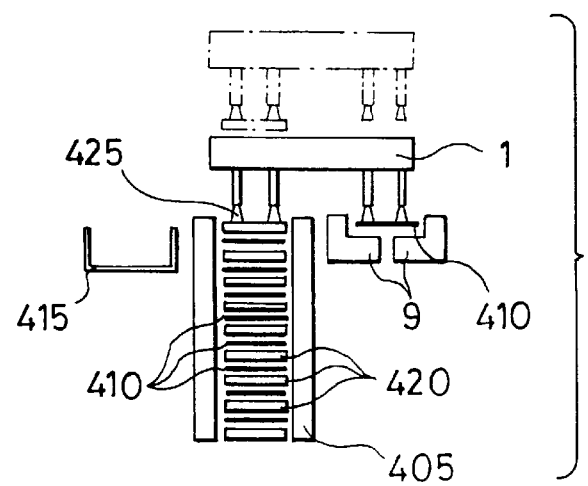
FIG. 11 is a schematic diagram of steps of separating the lead frame by using a lead frame separator of the die-bonding apparatus in the in-line system according to the present invention.

FIG. 11 is a schematic diagram showing the operation of a lead frame-separating apparatus, which may be employed for the die-bonding apparatus in the in-line system according to the present invention. The lead frame (2) is fed to the rail (9) of die-bonding apparatus (300 in FIG. 10), and the feed-in speed of the lead frame is controlled depending on the speed of die-bonding and wire-bonding. The apparatus shown in FIG. 11 is disclosed in Korean patent application No. 95-21641 filed on Jul. 21, 1995. A buffering material (420), for example paper is interlaid between the lead frames (410) in the stocker (405) in order to prevent failures of lead frames during the wire-bonding process due to bending of the lead frames, and one operation of the apparatus (1) makes it possible to remove the buffering material (420) and, at the same time, to pick-up and transport lead frames to the die bonding rail (9). Apparatus (1) picks-up buffering material (420) or a lead frame (410) using a vacuum pad (425), and can reciprocate in vertical and horizontal directions. The simultaneous dropping of a lead frame (410) on the rail (9) by the right vacuum pad and picking-up of buffering material (420) from the stocker (405) by the left vacuum pad can be accomplished by simultaneously turning-off the right vacuum pad and turning-on the left vacuum pad. Apparatus (1) reciprocates in a vertical direction and a horizontal direction, to feed the next lead frame on the rail (9). Such apparatus, provided with two vacuum pads (425), makes it possible to enhance the productivity of die-bonding process by increasing the speed of separating lead frames, compared with the conventional apparatus provided with one vacuum pad.

Figure 12B:
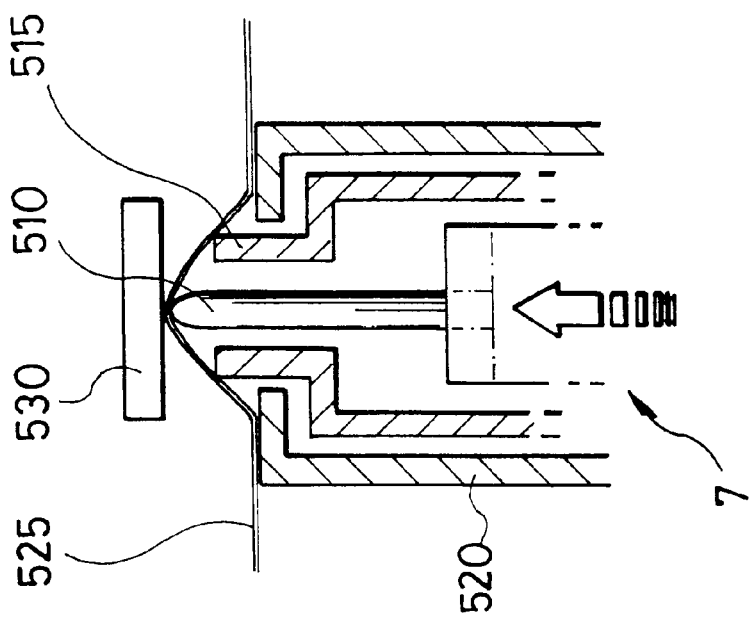
FIGS. 12A and 12B are schematic sectional views of separating the semiconductor chip by using a two-step chip separator of the die bonding apparatus in the in-line system according to the present invention.
Figure 12A:
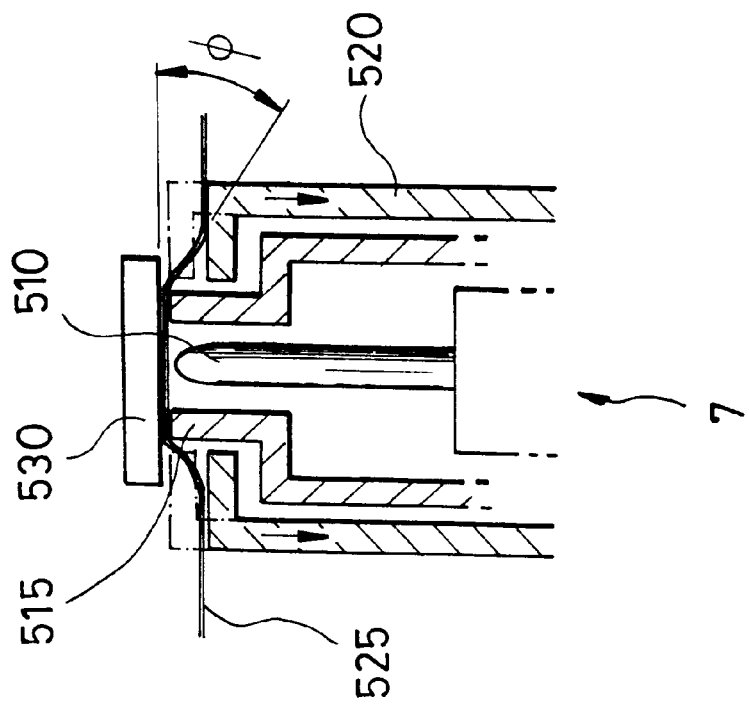

FIGS. 12A and 12B are schematic diagrams showing the operation of the chip-separating apparatus, which may be employed in the in-line system according to the present invention. The wafer mounted on xy-table (6) of die-bonding apparatus (300), shown in FIG. 10, comprises a plurality of individual chips ("dice") prepared through the steps of integrated circuit preparation, EDS (Electrical Die Sorting) and scribing, and is covered with a sheet of adhesive tape at its inactive surface. The individual chips are separated from the wafer by the steps shown in FIG. 12. The apparatus shown in FIG. 12 is disclosed in Korean patent application No. 95-18136, filed on Jun. 29, 1995.

With reference to FIGS. 12A and 12B, the apparatus (7) is provided with a plunge pin (510) for pushing up a chip (530) attached with adhesive tape (525), ejecting part (515) and cylinder (520). The apparatus (7) makes it possible to separate a chip from the tape in two steps in order to prevent the formation of cracks in the chip or package by the plunge pin (510).

The first separation step for the chip is shown in FIG. 12A. The cylinder (520) has a flat top surface in order to attain a stable mounting of a chip thereon. Before the first separation, the top surface of the cylinder (520), the top surface of the ejected part (515) and the top of the pin (510) have the same heights. The wafer should be closely fixed to the top surface of the cylinder so that vacuum is formed therebetween. When the cylinder (520) moves downward, the wafer is inclined downward accordingly by the action of vacuum suction, except the chip in contact with the plunge pin (510) and the ejected part (515). As a result, the tape (525) stuck to edges of the chip (530) is detached therefrom.

The distance that the cylinder moves is preferably determined so that the angle "φ" can be within a range from 5 degrees to 10 degrees. Accordingly, about 40–50% of the area of the tape stuck to the chip can be detached.

After that, the remaining parts of the tape adhered to the chip can be entirely detached, by moving upward the pin (510) as shown in FIG. 12B. Thus separated the chip (530) is transported to the die-bonding head by the collet (305 in FIG. 10) for chip attachment. The apparatus (7) separates chip in two steps, thereby making it possible to separate the chip with less force and to reduce the impact on the chip by the plunge pin (510). Tape separated from a chip by a plunge pin only, without an ejecting part and cylinder, in one step has a clear and deep mark, suggesting that the chip is also damaged. Such damage may cause the formation of a crack in the chip or package. The larger the chip, the larger the damage or impact by the plunge pin.

Hereinabove, the method and apparatus of transporting lead frame in an in-line system wherein a die-bonding apparatus is coupled with a plurality of wire-bonding apparatus has been described. However, the present invention can be applied to any process which requires the transport of lead frames on a rail, for example when a wire-bonded lead frame is transferred to a trim/forming process, in which the molded packages as a strip are trimmed to separate the structure into individual packages and then formed to have a proper shape of outer leads, for example J-shaped outer leads.

Figure 13:
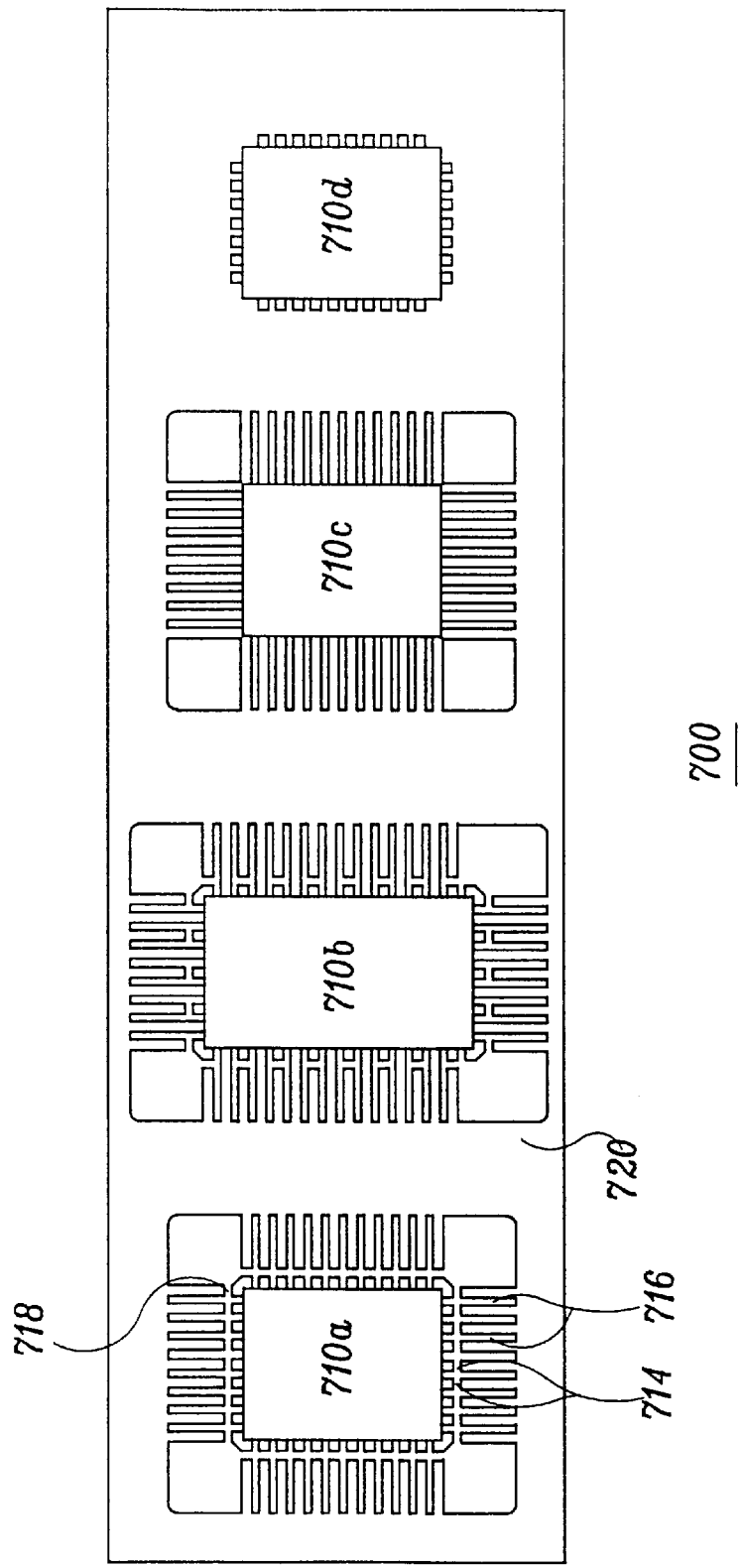
FIG. 13 is a plan view of a lead frame, which shows the steps of trimming and forming of a semiconductor chip package.

FIG. 13 is a plan view showing the progress of trim/forming from left to right sides in the drawing. A semiconductor element (710a) is comprised of a chip attached to a lead frame in the form of a strip, which is encapsulated by a molding process to form a package body. The package body (710) is flushed to remove impurities from the inner leads and the space between the dam-bar (714) and the body (710), and outer leads (716) are surface-treated by plating tin-lead alloy by means of an electroplating method. The dam-bar (714) has a role to prevent an the overflow of molding resins during encapsulation, and the tie bar (718) has a role of the supporting element during package assembly by connecting the inner leads and the outer leads (716) to the side rail (720) of the lead frame.

The semiconductor element (710b) is in the state in which the dam-bar (714) between the inner leads and the outer leads (716) is cut away. If all the dam-bars (714) are cut away at once, the impact on the leads is significant. Accordingly, alternate dam-bars are cut away.

The semiconductor element (710c) is in the state in which the remaining alternate dam-bars and tie bars (718) are cut away.

The resulting package with cut dam-bars and cut tie bars is then subjected to a forming process wherein the outer leads (716) are cut and bent to have a proper shape to be adapted to a mounting board (semiconductor element 710d). The resulting package (710d) is then subjected to various tests such as burn-in tests, electrical tests, and reliability tests, including a PCT (Pressure Cooker Test) or T/C (Temperature Cycling) test.

FIG. 13 is presented in order to show how the leads and dam-bars are trimmed/formed in the course of the trim/forming process, not the real process. In fact, a lead frame strip containing 8 or 10 semiconductor elements are trimmed and then formed by using separate trimming and forming modules, or an integrated trimming/forming module.

Figure 14:
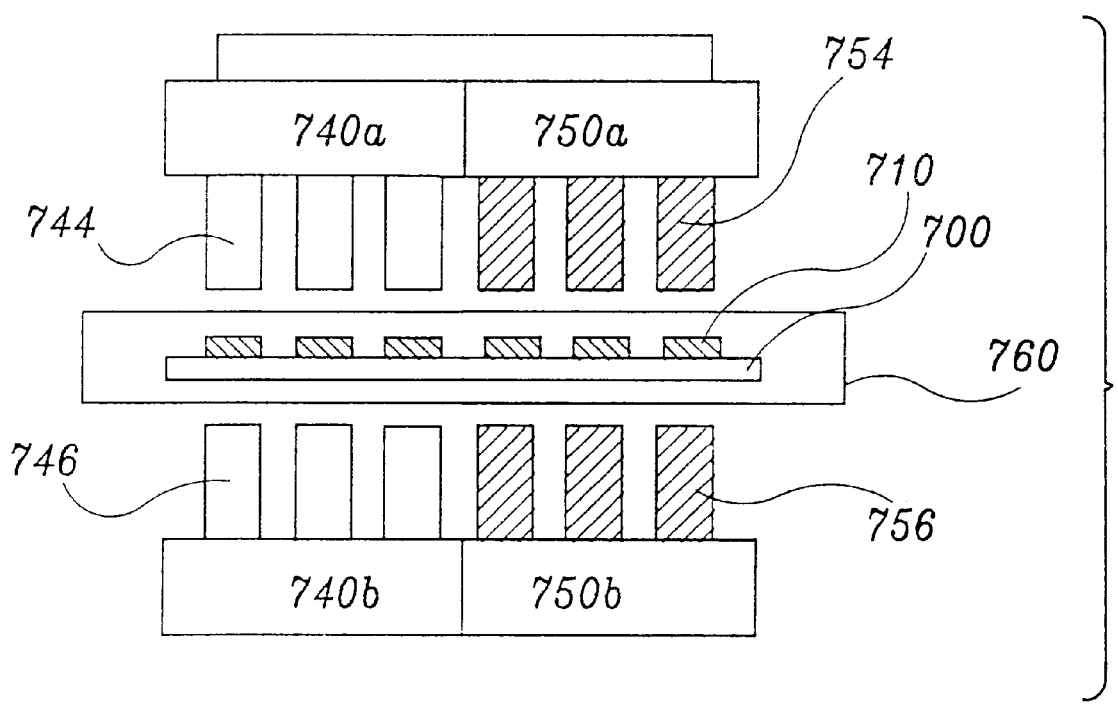
FIG. 14 is a schematic view of the in-line trimming and forming apparatus employing the air-transferring mechanism according to the present invention.

FIG. 14 is a schematic diagram of an in-line trimming/forming apparatus. Trimming (740) and forming (750) apparatus is comprised of upper molds (740a, 750a), each having three trimming blades (744, 754) for cutting the dam-bars, tie bars and outer leads, and lower molds (740b, 750b) for supporting the semiconductor element (710) during the trim/forming process. The lower molds are in contact with the element during the trim/forming process. The lead frame strip (700) moves on the guide rail (760). A controller (not shown) within the upper mold (740a) detects the position of the lead frame (700) and controls the operations of the trimming (740) and forming (750) apparatus as well as the moving/stopping of the lead frame (700).

Figure 15:
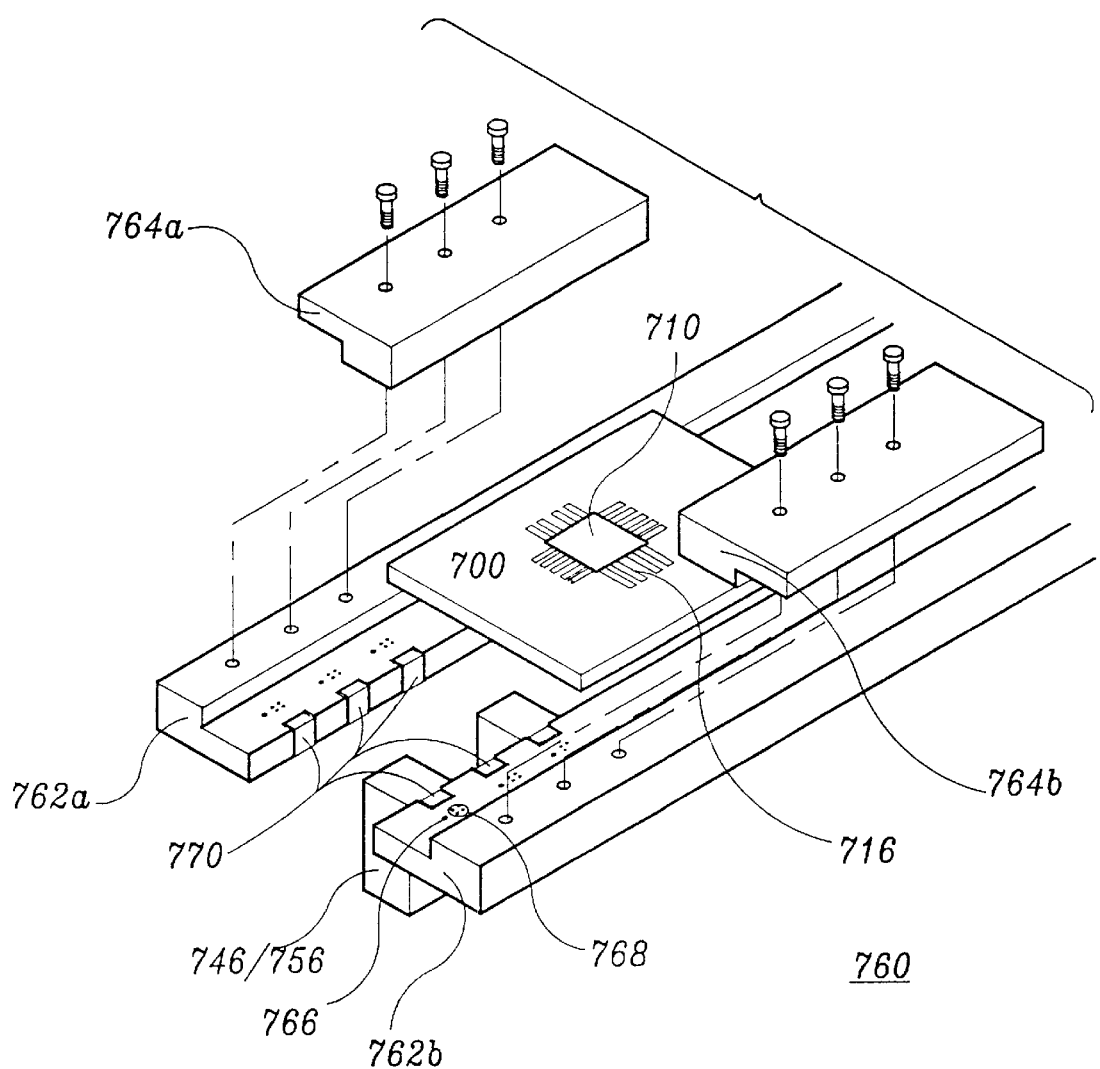
FIG. 15 is a partial perspective view of the guide rail of the in-line trimming and forming apparatus employing the air-transporting mechanism according to the present invention.

FIG. 15 is a partial perspective view of the in-line trimming/forming apparatus. The guide rail (760) is comprised of an air rail (762) on which the lead frame strip (700) moves, and a clamp (764) for holding the lead frame (760) during the trim/forming process. The air rail (762) is composed of two opposite, spaced rails (762a, 762b). The lower mold (740b in FIG. 14) of the trimming apparatus (740 in FIG. 14) or the lower mold (750b in FIG. 14) of the forming apparatus (750 in FIG. 14) positions at the space between rails (762a, 762b) and supports the semiconductor element (710). The air rail (762) is comprised of an air vent (766) for ejecting pressurized air as power for moving the lead frame and a vacuum hole (768) for stopping the lead frame. The lead frame may be broken by the molds, when the alignment of the lead frame is not correct. Therefore, a sensor (770) for detecting the position of the lead frame is provided at the air rail (762) for controlling the flow of the pressurized air or vacuum by transmitting signals from the sensor (770) to the control part (730 In FIG. 13).

Usually, the lead frame strip has index holes (not shown) in order to be used for transporting the lead frame. However, such transport of the lead frame causes an inevitable abrasion of parts of the apparatus and a decrease in productivity. To the contrary, according to the present invention, since mechanical parts are rarely employed for transporting the lead frames, problems associated with mechanical transport, for example, abrasions of parts or lead frame failures can be effectively eliminated.

Although few embodiments wherein the lead frame is transported in the in-line die bonding/wire bonding system and in the in-line trim/forming system, are described herein, it will be apparent to the ordinary skilled person in the art that the method and apparatus can be applied to other assembly stages in which lead frames should be transported.

Further, for preparation of memory modules, a printed wiring board can be transported by using pressurized air instead of conventional conveyor belts.

Although preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

We claim:

1. An apparatus for transporting a lead frame in a manufacturing line of semiconductor chip package devices, said apparatus comprising:

rails along which said lead frame moves, said rails having air vent holes;

an air supplying means for blowing air through said air vent holes to move said lead frame;

a detector means for detecting a position of the lead frame on the rails, said detector means being placed beneath said rails; and a stop means for stopping said lead frame, said stop means being positioned following said detector means in a direction of movement of the lead frame along said rails.

2. The apparatus of claim 1, which further comprises:

a control means arranged for controlling said air supplying means and said stop means.

3. The apparatus of claim 2, wherein:

said vent holes are formed at an angle ranging from about 10 degrees to 20 degrees with respect to a moving plane of said lead frame when moving in said direction of movement along said rails.

4. The apparatus of claim 2, wherein:

said stop means comprises a vacuum hole for applying vacuum between said rails and said lead frame.

5. The apparatus of claim 3, wherein:

said stop means further comprises a stopper to stop said lead frame from moving in said direction of movement along said rails.

6. The apparatus of claim 2, wherein:

said rails comprise a plurality of sub-rails each being formed so that an upper edge thereof has a slanted surface facing the lead frame as said lead frame moves along said rails.

7. An in-line die bonding and wire bonding apparatus comprising:

(i) a die bonding means for attaching a semiconductor chip to a lead frame by means of an adhesive, said lead frame comprising leads arranged to be electrically connected to semiconductor elements of the semiconductor chip;

(ii) a curing means for curing said adhesive;

(iii) a plurality of wire bonding means for electrically connecting said leads of said lead frame to the semiconductor elements of said chip via wires;

(iv) an apparatus for transporting said lead frame from said die bonding means to said wire bonding means;

(v) a buffering means associated with said transporting apparatus for controlling the speed of transporting said lead frame from said die bonding means to said wire bonding means;

(vi) a control part for controlling said in-line apparatus; and (vii) wherein said apparatus for transporting the lead frame comprises:

(a) rails on which said lead frame is moved, said rails having air vent holes disposed at an angle with respect to a plane of said lead frame as said lead frame moves on said rails;

(b) an air supplying means for blowing air through said vent holes to move said lead frame on said rails;

(c) a stop means for stopping said lead frame;

(d) a detector means for detecting the position of the lead frame on the rails, said detector means being placed beneath said rails; and (e) a control means for controlling said air supplying means and said stop means.

8. The in-line die bonding and wire bonding apparatus of claim 7, wherein:

said air vent holes are disposed at an angle ranging from about 10 degrees to 20 degrees with respect to said plane of said lead frame.

9. The in-line die bonding and wire bonding apparatus of claim 7, wherein:

said control means for controlling said air supplying means and said stop means comprises an input switch connected to said part for controlling said in-line apparatus and arranged for receiving signals from said detector means, and an output switch for transmitting control signals to said air supplying means; and said air supplying means is arranged to supply or not supply air, depending on said control signals from said output switch.

10. The in-line die bonding and wire bonding apparatus of claim 9, wherein said air supplying means comprises:

an air duct through which the air passes when being supplied;

a solenoid having an iron core wound with a coil connected to said output switch; and a valve for shutting off air flow through said air duct dependent on operation of said solenoid in response to signals received by said coil from the output switch.

11. The in-line die bonding and wire bonding apparatus of claim 7, wherein:

said stop means comprises at least one vacuum hole arranged for applying vacuum between said rails and said lead frame.

12. The in-line die bonding and wire bonding apparatus of claim 7, wherein:

said rails are comprised of a plurality of sub-rails, each being formed so that an upper edge thereof facing the lead frame when fed into said rails has a slanted surface.

13. The in-line die bonding and wire bonding apparatus of claim 12, wherein said sub-rails are uniformly spaced from each other and each has at least one said air vent hole.

14. The in-line die bonding and wire bonding apparatus of claim 7, wherein:

said rails are arranged to have said lead frame substantially float thereon.

15. The in-line die bonding and wire bonding apparatus of claim 7, wherein said die bonding means further comprises:

a chip separating means for separating individual chips from a wafer containing a plurality of chips;

a lead frame picking means for picking-up individual lead frames from a stocker containing a plurality of lead frames; and a bonding head for attaching said chip to said frame with an adhesive under pressure and heat.

16. The in-line bonding and wire bonding apparatus of claim 15, wherein:

said lead frame stocker is arranged to contain a plurality of lead frames together with buffering material interlaid between; and said lead frame picking means comprises a first vacuum pad for picking-up one of said lead frames from the stocker and feeding it to the rails of the die bonding means, and a second vacuum pad for picking-up the buffering material.

17. The in-line die bonding and wire bonding apparatus of claim 15, wherein:

said chip separating means is arranged to separate an individual chip from a wafer in two steps.

18. The in-line die bonding and wire bonding apparatus of claim 7, wherein:

said lead frame transport apparatus has an inlet magazine arranged to have die bonded lead frames fed thereinto from said wire bonding means, and an outlet magazine arranged to have wire bonded lead frames fed thereinto from said wire bonding means.

19. The in-line die bonding and wire bonding apparatus of claim 7, wherein said wire bonding means comprises:

a bonding head for electrically connecting said chip to said lead frame;

a loading belt for transporting said lead frame from said lead frame transport apparatus to said bonding head; and an unloading belt for transporting a wire bonded lead frame from said bonding head to said lead frame transport apparatus.

20. The in-line die bonding and wire bonding apparatus of claim 19, wherein:

said loading and unloading belts each comprise a motor, a conveyor belt, operated by said motor, and rollers, onto which said conveyor belt is wound.

21. The in-line bonding and wire bonding apparatus of claim 11, wherein said stop means further comprises:

a plate stopper arranged to collide with the lead frame.

* * * * *